United States Patent
Suzuki

(10) Patent No.: US 6,392,530 B2
(45) Date of Patent: May 21, 2002

(54) RESISTOR ARRAY BOARD

(75) Inventor: Etsuji Suzuki, Kanagawa-ken (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 09/866,711

(22) Filed: May 30, 2001

(30) Foreign Application Priority Data

Jun. 9, 2000 (JP) ........................................ 2000-173060

(51) Int. Cl.$^7$ ................................................ H01L 1/01
(52) U.S. Cl. ...................... 338/320; 338/260; 338/261; 338/310; 338/311; 338/252; 338/319
(58) Field of Search ................................. 338/319, 320, 338/260, 220, 221, 322, 261, 310, 311, 252

(56) References Cited

U.S. PATENT DOCUMENTS

| | | | | |
|---|---|---|---|---|
| 521,843 A | * | 6/1894 | Baker | 338/252 |
| 563,780 A | * | 7/1896 | Minchev | 338/252 |
| 1,251,507 A | * | 1/1918 | Gray | 338/320 |
| 1,255,326 A | * | 2/1918 | Macnicol | 338/320 |
| 2,176,604 A | * | 10/1939 | Benkelman | 338/320 |
| 2,261,350 A | * | 11/1941 | Epstein | 338/320 |
| 2,487,098 A | * | 11/1949 | Carington et al. | 338/252 |
| 2,875,312 A | * | 2/1959 | Norton | 338/252 |
| 5,105,340 A | * | 4/1992 | Lawrence | 338/260 |
| 5,539,857 A | * | 7/1996 | McGrevy | 392/484 |

FOREIGN PATENT DOCUMENTS

JP 10-185989 7/1998

* cited by examiner

*Primary Examiner*—Karl D. Easthom
(74) *Attorney, Agent, or Firm*—Wenderoth, Lind & Ponack, L.L.P.

(57) ABSTRACT

A plurality of protective resistors can be easily inserted between circuit forming elements, and opposite ends of each protective resistor can be properly press-contacted to each circuit forming element. The protective resistor can be easily replaced when broken. A resistor array board comprises a porous plate having a plurality of through-holes arranged in array and opening at opposite surfaces thereof; and a plurality of protective resistors removably loosely inserted into the through-holes, respectively. Each of the protective resistors are resiliently retained by an electrically conductive spring element, and opposite ends of each of the protective resistors are press-contacted with the circuit forming elements which are arranged in opposing relation on surfaces of the porous plates.

10 Claims, 3 Drawing Sheets

RESISTOR ARRAY BOARD

BACKGROUND OF THE INVENTION

1. Field of the Invention

This invention relates to a resistor array board which is interposed between circuit forming elements such that a plurality of resistors are inserted between the elements.

2. Related Art

In general, for mounting conventional protective resistors, there is employed, among others, a method in which terminals of protective resistors are inserted into through-holes of circuit forming elements and the terminals are attached thereto by soldering. There is also employed a method in which a plurality of resistors are loaded on a board by soldering and the board is connected to circuit forming elements.

As means for mounting, as one group, a plurality of protective resistors, Japanese Patent Application Unexamined Publication No. H10-185989 discloses a method in which a plurality of protective resistors are molded to form a resistor package such that male terminals of the protective resistors project from opposite surfaces of the resistor package, and the male terminals are inserted into through-holes of circuit forming elements and soldered, and then the resistor package is mounted between the circuit forming elements.

However, the above-mentioned conventional methods have such problems that the work for inserting the protective resistors is complicated and time consuming. Moreover, in the latter method for mounting the resistor package into the through-holes, although the protective resistors can be mounted as one group, there are encountered such problems that the method cannot cope with a construction in which the opposite ends of the protective resistors are press contacted with the two circuit forming elements, the resistor package must be totally discarded when the protective resistor(s) is broken, and heat accumulation adversely affects electronic parts.

SUMMARY OF THE INVENTION

It is, therefore, an object of the present invention to provide a resistor array board, in which a plurality of protective resistors can easily be inserted as one group merely by interposing a resistor array board between circuit forming elements and opposite ends of the protective resistors can properly be press contacted with the circuit forming elements.

Another object of the present invention is to provide a resistor array board, in which a protective resistor(s) can easily be replaced when broken.

To achieve the above objects, a resistor array board according to the present invention comprises a porous plate having a plurality of through-holes arranged in array and opening at opposite surfaces thereof; and a plurality of protective resistors removably loosely inserted into the through-holes.

Each of the protective resistors is resiliently retained by each electrically conductive spring element, and opposite ends of each of the protective resistors are press contacted, either directly or indirectly, with each of circuit forming elements which are arranged in opposing relation on each surface of the porous plate.

Preferably, one end of the protective resistor is resiliently retained by the electrically conductive spring, one end of the protective resistor is press contacted with one of the circuit forming elements through the electrically conductive spring element and the other end of the protective resistor is press contacted with the other circuit forming element.

The porous plate is formed of a metal plate, and the resistor array board further comprises means for connecting the porous plate to a grounding line of one or both of the circuit forming elements, so that the means serves as a shield plate in which a shielding effect can be obtained by the porous plate.

The porous plate has a through-hole therein formed separately from the plurality of through holes in which the plurality of protective resistors are loosely inserted, a grounding contact is loosely inserted in the separately formed through-hole, the grounding contact is resiliently retained by the electrically conductive spring element, opposite ends of the grounding contact are press contacted, either directly or indirectly, with the circuit forming element by a resilient force of the electrically conductive spring element, and a grounding line is formed between the circuit forming elements.

The porous plate has a through-hole therein formed separately from the plurality of through holes in which the plurality of protective resistors are loosely inserted, a power supply contact is loosely inserted in the separately formed through-hole, the power supply contact is resiliently retained by the electrically conductive spring element, opposite ends of the power supply contact are press contacted, either directly or indirectly, with the circuit forming element by a resilient force of the electrically conductive spring element, and a power supply line is formed between the circuit forming elements.

Preferably, the porous plate is formed of a metal plate and an inner peripheral surface of the through-hole for allowing the protective resistor of the porous plate to be loosely inserted therein is coated with an insulative material.

DETAILED DESCRIPTION OF THE INVENTION

The present invention will now be described in the form of one preferred embodiment with reference to FIGS. 1 to 7.

Figure 1:
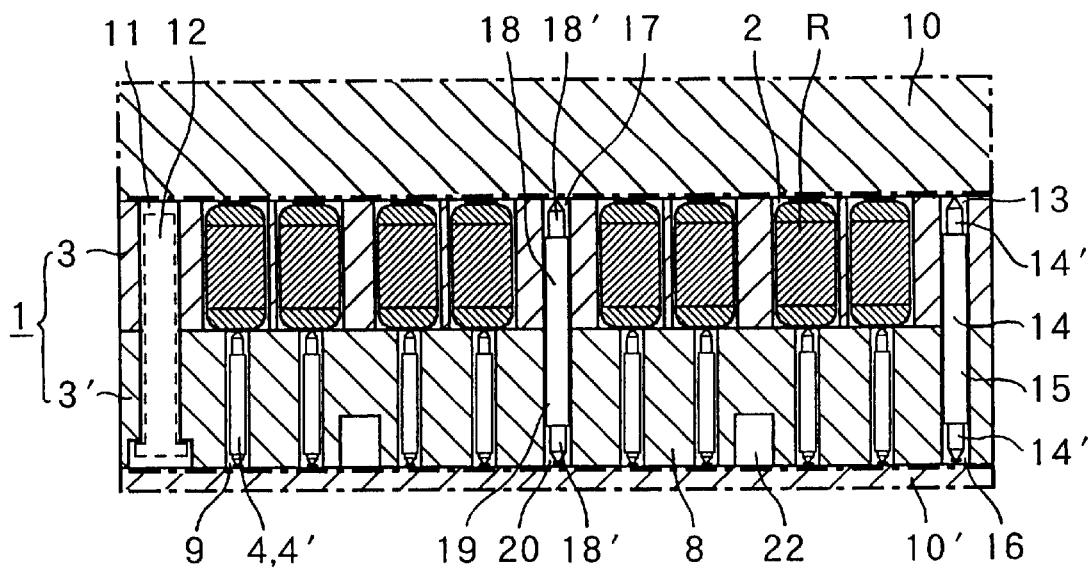
FIG. 1 is a sectional view showing one example of a construction of a resistor array board according to the present invention interposed between circuit forming elements.
Figure 2:
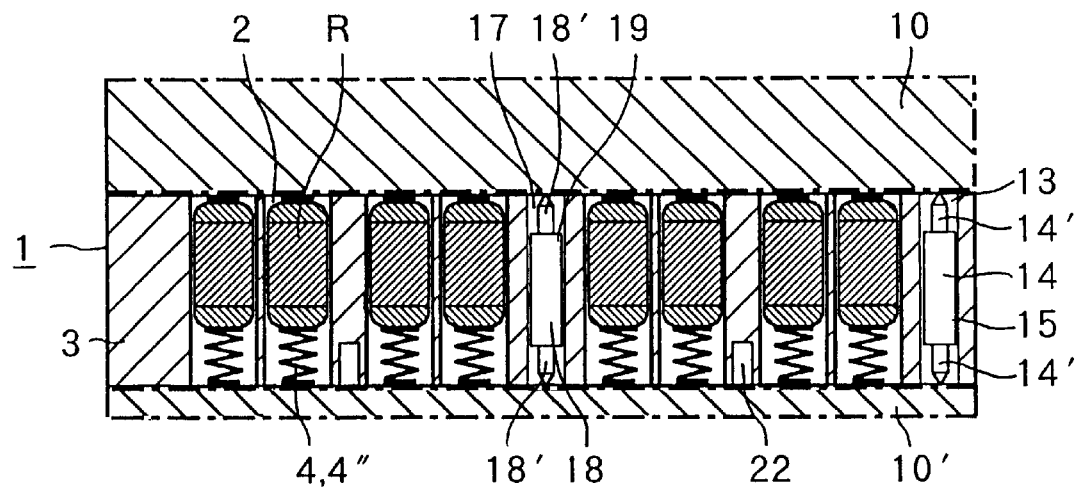
FIG. 2 is a sectional view showing another example of a construction of a resistor array board according to the present invention interposed between circuit forming elements.

As shown in FIGS. 1 and 2, a resistor array board 1 of the present invention is formed by forming a porous plate 3 having a plurality of through-holes 2 opening to opposite surfaces thereof and arranged in juxtaposed relation and by removably loosely inserting the protective resistors R into the corresponding through-holes 2 in the axial direction.

Figure 5:
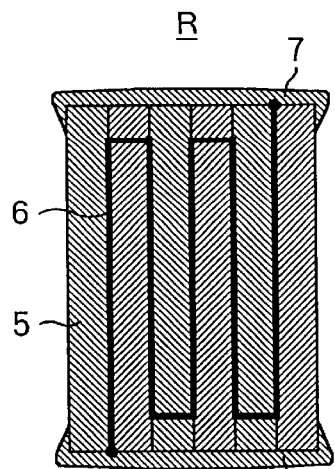
FIG. 5 is a sectional view of the above protective resistor.

Each resistor R is, as shown in FIG. 5, formed by passing the wiring 6 between adjacent layers of a multilayer insulative block 5 which is composed of a laminated body of insulative pieces such as ceramics. One end of the wiring 6 is connected to an electrode 7 intimately contacted with an upper end of the block 5 and the other end of the wiring 6 is connected to an electrode 7' intimately contacted with a lower end of the block 5. The electrodes 7, 7' are formed of metal having a low melting point such as Sn. The electrodes 7, 7' are attached to the upper and lower ends of the multilayer insulative block 5, respectively. The protective resistor R has, for example, a prismatic or cylindrical configuration as a whole.

Figure 3:
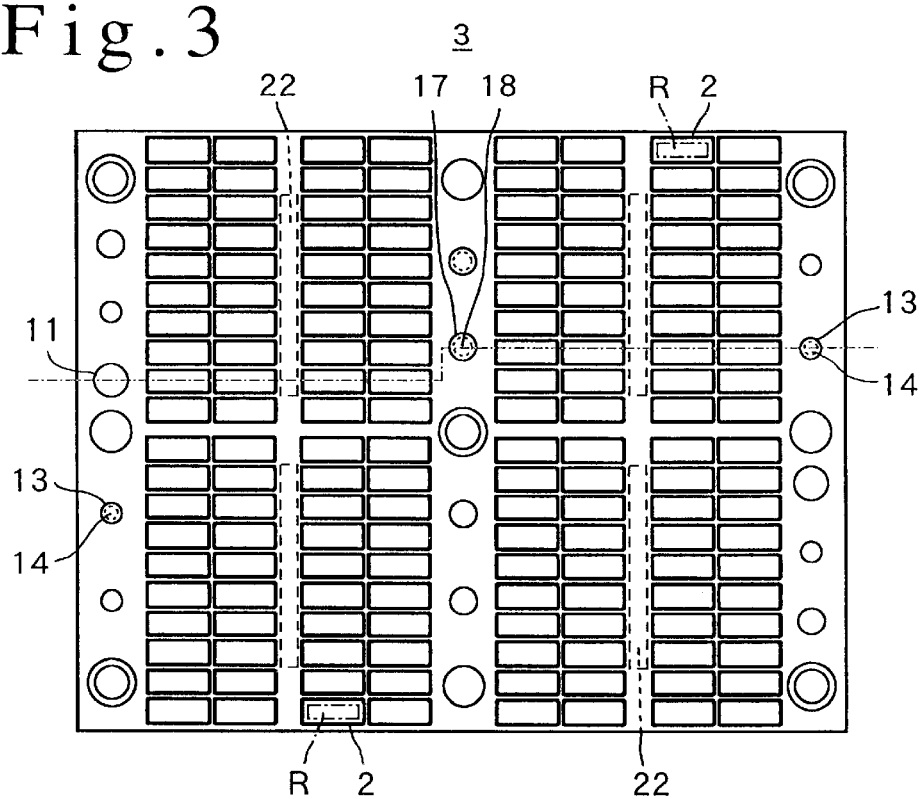
FIG. 3 is a plan view showing a porous plate, in which a protective resistor is omitted, forming the above resistor array board.
Figure 4:
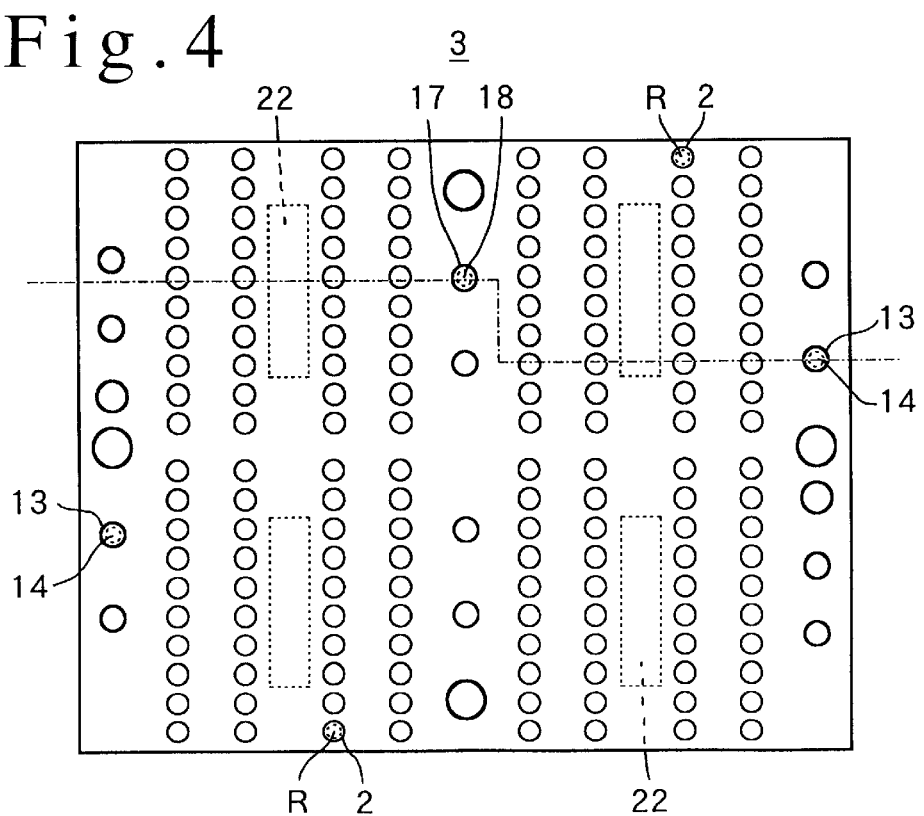
FIG. 4 is a plan view showing another example of the porous plate, in which the protective resistor is omitted.

As shown in FIGS. 3 and 4, the configuration of each through-hole 2 formed in the porous plate 3 also has, for example, a prismatic or cylindrical configuration so as to match with the configuration of the protective resistor R. Each protective resistor R can be removably inserted into the corresponding through-hole 2 of the porous plate 3 in the axial direction so that only broken protective resistor(s) R can be replaced.

Each protective resistor R loaded in the corresponding through-hole 2 is resiliently retained by an electrically conductive spring element 4. One specific example of its construction will now be described with reference to FIG. 1.

A double face multi-point connecting board 8 having a plurality of contactors 4' (electrically conductive elements) is formed, and the double face multi-point connecting board 8 is superposed on the porous plate 3 such that the surface of the double face multi-point connecting board 8 is confronted (each plate face is confronted) with the surface of the porous plate 3 to thereby form the resistor array board 1.

The double face multi-point connecting board 8 forms the porous plate 3' having a plurality of through-holes 9 which is open at the opposing two surfaces, a pin-type contactor 4' having a compressive elasticity in a thickness direction (axial direction of the through-hole 9) of the double face multi-point connecting board 8 is loosely and removably inserted into the through-hole 9 in an axial direction of the through-hole 9.

Figure 7:
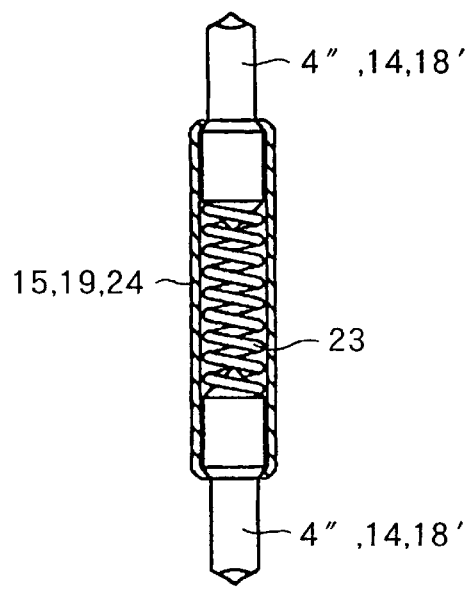
FIG. 7 is a sectional view showing a contactor, a grounding contact or a power source contact having the above resistor array board.

As shown in FIG. 7, the contactor 4' uses the pin-type contactor which is composed of a pin terminal 4" fitted in a sleeve 24 such that the pin terminal 4" is nested in the sleeve 24. For example, one pair of pin terminals 4" (male terminals) are inserted, in nesting structure, one in an upper part and the other in a lower part of the interior of the sleeve 24, a spring 23 such as a coiled spring is built in the sleeve 24 such that the spring 23 is interposed between the pin terminals 4", and the pin terminals 4" are resiliently retained by the spring 23 so that the pin terminals 4" are repulsed upward and downward.

Each through-hole 9 of the porous plate 3' forming the multi-point connecting board 8 is provided in such a manner as to be communicated with each through-hole 2 of the porous plate 3, thereby forming a porous plate having a two-plate structure. Within the communicating through-holes 9, 2, one end of the protective resistor R is resiliently retained by one end of the contactor 4'.

The resistor array board 1 is interposed between circuit forming elements 10, 10', and the resistor array board 1 and the circuit forming elements 10, 10' are superposed such that their surfaces are confronted with each other. The upper and lower pin terminals 4" are pressed from opposite directions. As a result, the contactor 4' (electrically conductive spring element) is compressed to store resiliency.

Then, by the resilient force (biasing force) of the contactor 4', one end of the protective resistor R is caused to be press contacted, either directly or indirectly, with the circuit forming element 10 which is arranged in opposing relation to one surface (surface of the porous plate 3) of the resistor array board 1 and the other end is caused to be press contacted, through the contactor 4' (electrically conductive spring element) with the other circuit forming element 10' which is arranged in opposing relation to the other surface (surface of the multi-point connecting board 8) of the resistor array board 1.

That is to say, by interposing the resistor array board 1 between the circuit forming elements 10, 10', resistors can be inserted, as one group, between the circuit forming elements 10, 10'. In order to better ensure the press contact of the opposite ends of each contactor 4', the respective contacting parts may be soldered.

Preferably, a screw tightening hole 11 is formed in the porous plate 3 all the way through the porous plate 3' forming the double face multi-point connecting board 8, and a screw 12 is inserted in the screw tightening hole 11 to integrally connect the porous plates 3, 3' in their superposed relation, thereby maintaining a forming state of the resistor array board 1.

Referring again to FIG. 2, another specific example of a construction for resiliently retaining the protective resistor R by the electrically conductive spring element 4 will be described. The resistor array board 1 is formed by disposing the electrically conductive spring element 4 for resiliently retaining one end of the protective resistor R within the through-hole 2 of the porous plate 3 and disposing the electrically conductive spring element 4, for example, at the side opposite to the circuit forming element 10' as shown.

The resistor array board 1 is interposed between the circuit forming elements 10, 10' such that the surface of the resistor array board 1 is superposed with the surfaces of the circuit forming elements 10, 10' in confronting relation. By doing so, the electrically conductive spring element 4 is held in a resilient force accumulated state. By the resilient force (biasing force) thereof, one end of the protective resistor R is press contacted, either directly or indirectly, with the circuit forming element 10 which is disposed in an opposing relation to one surface (one surface of the porous plate 3) of the resistor array board 1 and the other end is press contacted, through the electrically conductive spring 4, with the other Circuit forming element 10' which is disposed in a confronting relation to the other surface (other surface of the porous plate 3) of the resistor array board 1.

That is to say, by interposing the resistor array board 1 between the circuit forming elements 10, 10', the resistors are inserted, as one group, between the circuit forming elements 10, 10'. In order to better ensure the pressure contact of the opposite ends of each electrically conductive spring element 4, the respective contact parts may be soldered.

The porous plate 3 has a through-hole 13 which is formed separately from the through-holes 2 into which the protective resistors R are loosely inserted, and a pin-type grounding contact 14 is loosely inserted in the through-hole 13 in the thickness direction.

As shown in FIG. 7, the grounding contact 14 uses the pin-type contactor which is composed of a pin terminal 4" fitted in a sleeve 15 such that the pin terminal 14' is nested in the sleeve 24. For example, one pair of pin terminals 14' (male terminals) are inserted, in nesting structure, one in an upper part and the other in a lower part of the interior of the sleeve 15, a spring 23 such as a coiled spring is built in the sleeve 15 such that the spring 23 is interposed between the pin terminals 14', and the pin terminals 14' are resiliently retained by the spring 23 so that the pin terminals 14' are repulsed upward and downward.

The resistor array board 1 is interposed between the circuit forming elements 10, 10'. The upper and lower pin terminals 14' are pressed from opposite directions by the circuit forming elements 10, 10' to compress the electrically conductive spring element. Then, by the resilient force (biasing force) of the electrically conductive spring element, opposite ends of the grounding contact 14 are caused to be press contacted, either directly or indirectly, with the circuit forming elements 10, 10' at the respective surfaces of the resistor array board 1, thereby forming a grounding line between the circuit forming elements 10, 10'.

As shown in FIG. 1, in the case where a resistor array board 1 having a two-plate structure is formed, the through-hole 13 of the porous plate 3 and the through-hole 16 of the porous plate 3' of the double face multi-point connecting plate 8 are in communication with each other, and the grounding contact 14 is loosely inserted into the communicating through-holes 13, 16.

In that case, one end of the grounding contact 14 is press contacted, either directly or indirectly, with the circuit forming element 10 at the surface of the porous plate 3 and the other end of the contact 9 is press contacted, either directly or indirectly, with the other circuit forming element 10' at the surface of the porous plate 3'.

The porous plate 3 has a through-hole 17 which is separately formed from the through-hole 2 into which the protective resistor R is loosely inserted and a pin-type power source contact 18 having a compressive elasticity in a thickness direction is loosely inserted into the through hole 17.

As shown in FIG. 7, the power source contact 18 uses the pin-type contactor which is composed of a pin terminal 18' fitted in a sleeve 15 such that the pin terminal 18' is nested in the sleeve 15. For example, one pair of pin terminals 18' (male terminals) are inserted, in nesting structure, one in an upper part and the other in a lower part of the interior of the sleeve 15, a spring 23 such as a coiled spring is built in the sleeve 15 such that the spring 23 is interposed between the pin terminals 18', and the pin terminals 14' are resiliently retained by the spring 23 so that the pin terminals 18' are repulsed upward and downward.

The resistor array board 1 is interposed between the circuit forming elements 10, 10'. The upper and lower pin terminals 18' are pressed from opposite directions by the circuit forming elements 10, 10' to compress the electrically conductive spring element. Then, by the resilient force (biasing force) of the electrically conductive spring element, opposite ends of the power source contact 18 are caused to be press contacted, either directly or indirectly, with the circuit forming elements 10, 10' at the respective surfaces of the resistor array board 1, thereby forming a power source line between the circuit forming elements 10, 10'.

As shown in FIG. 1, in the case where a resistor array board 1 having a two-plate structure is formed, the through-hole 17 of the porous plate 3 and the through-hole 20 of the porous plate 3' of the double face multi-point connecting plate 8 are in communication with each other, and the power source contact 18 is loosely inserted into the communicating through-holes 17, 20.

In that case, one end of the power source contact 18 is press contacted, either directly or indirectly, with the circuit forming element 10 at the surface of the porous plate 3 and the other end of the contact 18 is press contacted, either directly or indirectly, with the other circuit forming element 10' at the surface of the porous plate 3'.

The porous plates 3, 3', which constitute the resistor array board 1 of FIGS. 1 and 2, are formed of an insulative material such as a synthetic resin.

Figure 6:
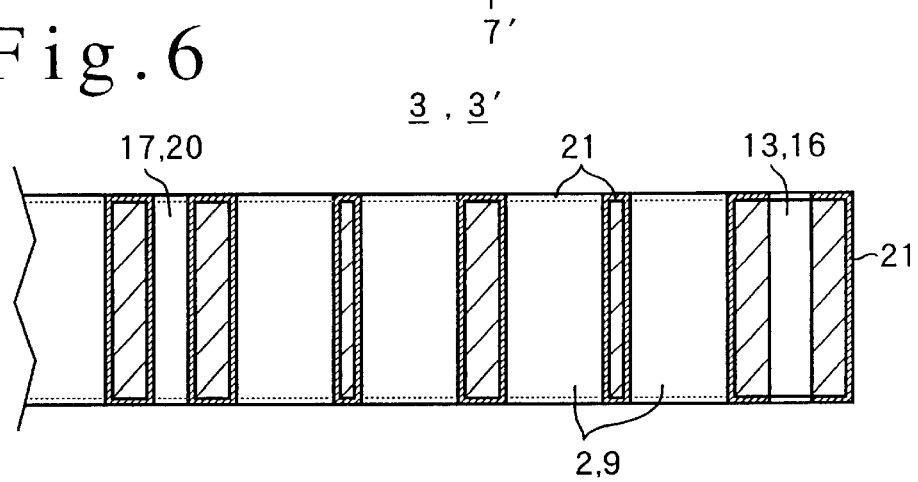
FIG. 6 is an enlarged sectional view of the above porous plate.

As shown in FIG. 6, the porous plates 3, 3' are formed of a metal plate, and the inner peripheral surfaces of the respective through-holes 2, into which the protective resistors R are loosely inserted, of the metal porous plates 3, 3' are applied with a coating 21 composed of an insulative material.

The opposite surfaces of the metal porous plates 3, 3', the inner peripheral surfaces of the respective through-holes 2 into which the protective resistors R are loosely inserted, the inner surfaces of the through-hole 9 into which the contactor 4' is loosely inserted and the through-holes 17, 20, into which the power source contacts 1 8 are loosely inserted are applied with a continuous coating 21 which is composed of an insulative material.

Means is provided for connecting the metal porous plate 3 to the grounding line of one or both of the circuit forming elements 10, 10'.

As one example, the metal porous plates 3, 3' are provided at proper places of their surfaces with a grounding terminal, or as shown in FIG. 6, the inner peripheral surfaces of the through-holes 13 or 13, 16, into which the grounding contact 14 is loosely inserted, are allowed to expose the electrically conductive metal surfaces instead of being applied with the insulative coating 21, and the grounding contact 14 is contacted with the electrically conductive surfaces, so that a signal for enhancing the grounding effect and shielding effect is delivered at a high speed.

The resistor array board 1 has a recess 22 at its surface opposite to the circuit forming elements 10, 10', and electronic parts such as a power source condenser chip loaded on the circuit forming elements 10, 10' are received in the recess 22.

In the resistor array board 1 having a two-plate structure of FIG. 1, the recess 22 is formed in a surface opposite to the circuit forming element 10' of the porous plate 3' of the double face multi-point connecting board 8. Moreover, in the case where a resistor array board having a plate structure of FIG. 2, the resistor array board is formed at the surface opposite to the circuit forming elements 10 of the porous plate 3.

According to the present invention, the object for inserting, as one group, a plurality of protective resistors can be achieved merely by interposing a single resistor array board between the circuit forming elements, and opposite ends of the respective resistors can properly be press contacted with the respective circuit forming elements. Moreover, the protective resistors are loosely removably inserted into the porous plate so that the protective resistor (s) can easily be replaced when the protective resistor(s) is broken.

The grounding line can easily be formed between the circuit forming elements through the grounding contact had by the resistor array board.

Moreover, the power source line can easily be formed between the circuit forming elements through the power supply contact had by the resistor array board.

Obviously, many modifications and variations of the present invention can be made in light of the above teachings. It is, therefore, to be understood that within the scope of the appended claims, the present invention may be practiced otherwise than as specifically described hereinbefore.

What is claimed is:

1. A resistor array board comprising a porous plate having a plurality of through-holes arranged in array and opening at opposite surfaces thereof; and a plurality of protective resistors removably loosely inserted in said through-holes, each of said protective resistors being resiliently retained by an electrically conductive spring element such that, when circuit forming elements are arranged in opposing relation on each surface of said porous plate, opposite ends of each of said protective resistors are press contacted with the circuit forming elements;

wherein said porous plate has a grounding contact through-hole separate from said plurality of through holes in which said plurality of protective resistors are loosely inserted, and a grounding contact is loosely inserted in said grounding contact through-hole, and said grounding contact is resiliently arranged in said grounding contact through-hole such that, when the circuit forming elements are arranged in opposing relation on each surface of said porous plate, opposite ends of said grounding contact are resiliently press contacted with the circuit forming elements to form a grounding line between the circuit forming elements.

2. A resistor array board according to claim 1, wherein when the circuit forming elements are arranged in opposing relation on each surface of said porous plate, one of said opposite ends of each of said protective resistors is press contacted with one of the circuit forming elements and the other end of each of said protective resistors is press contacted with the other circuit forming element.

3. A resistor array board according to claim 1, wherein said porous plate is formed of a metal plate, and means is provided for connecting said porous plate to a grounding line of at least one of the circuit forming elements.

4. A resistor array board according to claim 1, wherein said porous plate is formed of a metal plate, and an inner peripheral surface of each of said through-holes in which said protective resistors are inserted, is coated with an insulative material.

5. A resistor array board according to claim 2, wherein said porous plate is formed of a metal plate, and means is provided for connecting said porous plate to a grounding line of at least one of the circuit forming elements.

6. A resistor array board according to claim 2, wherein said porous plate is formed of a metal plate, and an inner peripheral surface of each of said through-holes in which said protective resistors are inserted, is coated with an insulative material.

7. A resistor array board comprising a porous plate having a plurality of through-holes arranged in array and opening at opposite surfaces thereof; and a plurality of protective resistors removably loosely inserted in said through-holes, each of said protective resistors being resiliently retained by an electrically conductive spring element such that, when circuit forming elements are arranged in opposing relation on each surface of said porous plate, opposite ends of each of said protective resistors are press contacted with the circuit forming elements;

wherein said porous plate has a power supply contact through-hole separate from said plurality of through holes in which said plurality of protective resistors are loosely inserted, a power supply contact is loosely inserted in said power supply contact through-hole, and said power supply contact is resiliently arranged in said power supply contact through-hole such that, when the circuit forming elements are arranged in opposing relation on each surface of said porous plate, opposite ends of said power supply contact are resiliently press contacted with the circuit forming elements to form a power supply line between the circuit forming elements.

8. A resistor array board according to claim 7, wherein when the circuit forming elements are arranged in opposing relation on each surface of said porous plate, one of said opposite ends of each of said protective resistors is press contacted with one of the circuit forming elements and the other end of each of said protective resistors is press contacted with the other circuit forming element.

9. A resistor array board according to claim 7, wherein said porous plate is formed of a metal plate, and means is provided for connecting said porous plate to a grounding line of at least one of the circuit forming elements.

10. A resistor array board according to claim 7, wherein said porous plate is formed of a metal plate, and an inner peripheral surface of each of said through-holes in which said protective resistors are inserted, is coated with an insulative material.

* * * * *